(12) United States Patent
Roohparvar

(10) Patent No.: US 6,614,691 B2
(45) Date of Patent: Sep. 2, 2003

(54) FLASH MEMORY HAVING SEPARATE READ AND WRITE PATHS

(75) Inventor: Frankie Fariborz Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/017,657

(22) Filed: Dec. 12, 2001

(65) Prior Publication Data

US 2003/0107923 A1 Jun. 12, 2003

(51) Int. Cl.$^7$ .............................................. G11C 16/26
(52) U.S. Cl. ..................... 365/185.23; 365/185.22; 365/185.33
(58) Field of Search ..................... 365/185.22, 185.23, 365/185.33

(56) References Cited

U.S. PATENT DOCUMENTS

| | | | |
|---|---|---|---|
| 5,663,908 A | 9/1997 | Roohparvar | 365/189.01 |
| 5,751,654 A | 5/1998 | Pascucci | 365/230.06 |
| 5,761,130 A | 6/1998 | Roohparvar | 365/189.01 |
| 5,761,131 A | 6/1998 | Roohparvar | 365/189.02 |
| 5,774,401 A | 6/1998 | Roohparvar | 365/189.02 |
| 5,867,430 A * | 2/1999 | Chen et al. | 365/189.04 |
| 6,081,456 A * | 6/2000 | Dadashev | 365/185.23 |
| 6,163,863 A | 12/2000 | Schicht | 714/718 |
| 6,172,893 B1 | 1/2001 | Ryan | 365/49 |
| 6,205,058 B1 | 3/2001 | Roohparvar | 365/185.33 |

* cited by examiner

Primary Examiner—Andrew Q. Tran
(74) Attorney, Agent, or Firm—Leffert Jay & Polglaze, P.A.

(57) ABSTRACT

A non-volatile memory device having separate read and write paths. In one embodiment, a flash memory device has a memory array, a first multiplexer and a second multiplexer. The memory array has non-volatile memory cells arranged in columns and rows. Each memory cell in a column is coupled to an associated bit line. The first multiplexer is coupled to select bit lines during write operations to the memory array. The second multiplexer is coupled to select bit lines during read operations from the memory array.

37 Claims, 5 Drawing Sheets

FLASH MEMORY HAVING SEPARATE READ AND WRITE PATHS

TECHNICAL FIELD OF THE INVENTION

The present invention relates generally to flash memories and in particular the present invention relates to a flash memory device having separate read and write paths.

BACKGROUND OF THE INVENTION

A flash memory is a type of non-volatile memory that retains data even after power has been removed from the memory. A flash memory device has a memory array that is divided into a plurality of individual blocks of memory cells. The memory cells in each block are arranged in row and column fashion. Each block can be independently erased with respect to other blocks in the memory array.

Each flash memory cell (cell) has a source, a drain, a floating gate and a control gate. In each memory block, the control gates of each cell in a row are coupled to an associated word line. Moreover, the drains of each cell in a column are coupled to an associated bit line. In addition, the sources of each cell in the memory block are coupled to a source line. To write to or program a cell, a positive voltage is applied to a word line coupled to the control gate of the cell. In addition, a positive voltage is applied to the bit line coupled to the drain of the cell while the source line voltage is held at ground. These voltages are applied so that the programmed cell has charge stored on its floating gate.

To read a cell, a positive voltage is applied to a word line coupled to a control gate of the cell. Moreover, a relatively small positive voltage is also applied to the bit line of the drain of the cell while the source is held at ground. The current conducted by the memory cell is measured to determine a data state. A block of memory is erased by placing the control gates of each memory cell in the block to ground while applying a relatively high voltage to the source line. In addition, the drain of each memory cell is left floating (open) during an erase operation. Thus the memory cells are erased by removing charge from the floating gate.

In selecting cells to program or read from, flash memory devices implement multiplexer circuits or decoder circuits. A multiplexer circuit is a logic device that selects between two or more inputs in providing an output. The multiplexer circuits are used to selectively couple desired voltages in writing to and reading from selected cells. One multiplexer, which can be referred to as an X decoder, is coupled to the word lines to select among the rows. Another multiplexer, which can be referred to as a Y multiplexer, is coupled to the bit lines to select between the columns. Multiplexer circuits generally comprise transistors formed in integrated circuits. Typically, the transistors in a multiplexer are formed with an oxide layer of approximately 200 Å having relatively long channel lengths. With an oxide layer of approximately 200 Å, the transistor can effectively handle 4 to 12 volts. Traditionally, the Y multiplexer is used to couple approximately 5.5 volts to a selected bit line during write operations and to provide a path to a circuit comprising sense amplifiers during read operations. At a program voltage of about 5.5 volts, the transistors supply a DC current of approximately 0.5 to 1 m Amps to the selected cell to be programmed.

A synchronous flash memory is a type of flash memory. Like a typical flash memory array, a synchronous flash memory has a memory divided in a plurality of erasable array blocks. However, unlike a typical flash memory, a synchronous memory is driven by a clock. In particular, a synchronous flash memory is designed to interface with typical SDRAM systems. Moreover, unlike a typical flash memory device that typically reads 16 cells at one time, synchronous flash memories can read 4,000 or more cells at one time. Generally, this requires the memory to have a sense amplifier for each bit line. Because of the increased number of sense amplifiers used in a synchronous flash memory, the speed in which the signals are transferred from the cells to the sense amplifiers (the "read path") is more of an issue in synchronous flash memory than in typical flash memory devices.

The transistors used in the Y multiplexer in the typical flash memory device are relatively high voltage transistors that are capable of delivering current with little voltage drop. These transistors tend to be relatively large and tend to add a relatively large amount of capacitance in the write and read paths. This capacitance reduces the speed of signals through the paths. Since, relatively low voltage transistors are all that is typically required in a read path, and relatively low voltage transistors allow for faster signals, the relatively high voltage transistors required for the write path unnecessarily slow signals in the read path.

For the reasons stated above, and for other reasons stated below which will become apparent to those skilled in the art upon reading and understanding the present specification, there is a need in the art for a non-volatile memory device having a relatively fast read path.

SUMMARY OF THE INVENTION

The above-mentioned problems with non-volatile memory devices and other problems are addressed by the present invention, and will be understood by reading and studying the following specification.

In one embodiment, a non-volatile memory device is disclosed. The nonvolatile memory device includes a memory array, a first multiplexer and a second multiplexer. The memory array has non-volatile memory cells arranged in columns and rows. Each memory cell in a column is coupled to an associated bit line. The first multiplexer is coupled to a first end of each bit line to select bit lines during write operations to the memory array. The second multiplexer is coupled to a second end of each bit line to select bit lines during read operations from the memory array.

In another embodiment, a flash memory device comprises a memory array having erasable blocks of memory cells, a state machine, a Y multiplexer and a latch/sense amplifier circuit. Each block of memory cells is arranged in row and column fashion. Each column of memory cells is coupled to an associated bit line. The state machine is used to control memory operations to the memory array. The Y multiplexer is used to select bit lines during write operations. The Y multiplexer is coupled to the state machine to receive select commands. Moreover, the multiplexer is coupled to a first end of the bit lines. The latch/sense amplifier circuit is used to selectively read memory cells. The latch/sense amplifier circuit is coupled to the state machine to receive select commands. The latch/sense amplifier circuit is further coupled to a second end of the bit lines.

In another embodiment, a flash memory device comprises a memory array, a first multiplexer and a second multiplexer. The memory array is comprised of non-volatile memory cells arranged in columns and rows. Each memory cell in a column is coupled to an associated bit line. The first multiplexer is coupled to select bit lines during write operations to the memory array. The second multiplexer is coupled to select bit lines during read operations from the memory array.

In another embodiment, a flash memory system comprises a processor, a memory array, control circuitry, a first multiplexer, and a second multiplexer. The processor is used to provide external commands and external data. The memory array is used to store data. Moreover, the memory array has blocks of memory cells arranged in rows and columns. Each memory cell in a column has a drain coupled to an associated bit line. The control circuitry is used to control memory operations. The control circuitry is coupled to the processor to receive the external commands. The first multiplexer is coupled to select among the bit lines during write operations. The first multiplexer is coupled to each bit line. The first multiplexer is further coupled to receive select commands from the control circuitry. The second multiplexer is coupled to select among the bit lines during read operations. The second multiplexer is coupled to each bit line. The second multiplexer is further coupled to receive select commands from the control circuitry. In addition, a write path isolation circuit is coupled to isolate the first multiplexer from the bit lines during a read operation. The write path isolation circuit is further coupled to receive isolation commands from the control circuitry. Moreover, a read path isolation circuit is coupled to isolate the second multiplexer from the bit lines during a write operation. The read path isolation circuit is further coupled to receive isolation commands from the control circuitry.

A method of operating a non-volatile memory device is also disclosed comprising, using a write path having a first multiplexer to selectively program flash memory cells in a memory array, wherein the first multiplexer is coupled to a first end of each bit line in the memory array, and using a read path having a second multiplexer to selectively read the flash memory cells in the memory array, wherein the second multiplexer is coupled to a second end of each of the bit lines in the memory array.

A method of operating a flash memory comprising, selecting among bit lines of a memory array using a Y multiplexer during write operations to the memory array, selecting among the bit lines of the memory array using a latch/sense amplifier circuit during read operations from the memory array, isolating the Y multiplexer from the bit lines during read operations to the memory array and isolating the latch/sense amplifier from the bit lines during write operations to the memory array.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention effectively separates components used in a read path from components used in a write path in a synchronous flash memory to increase efficiency. Before a detailed discussion of the present invention is disclosed, further background is first provided to provide a basis for better understanding of the present invention.

Figure 1:
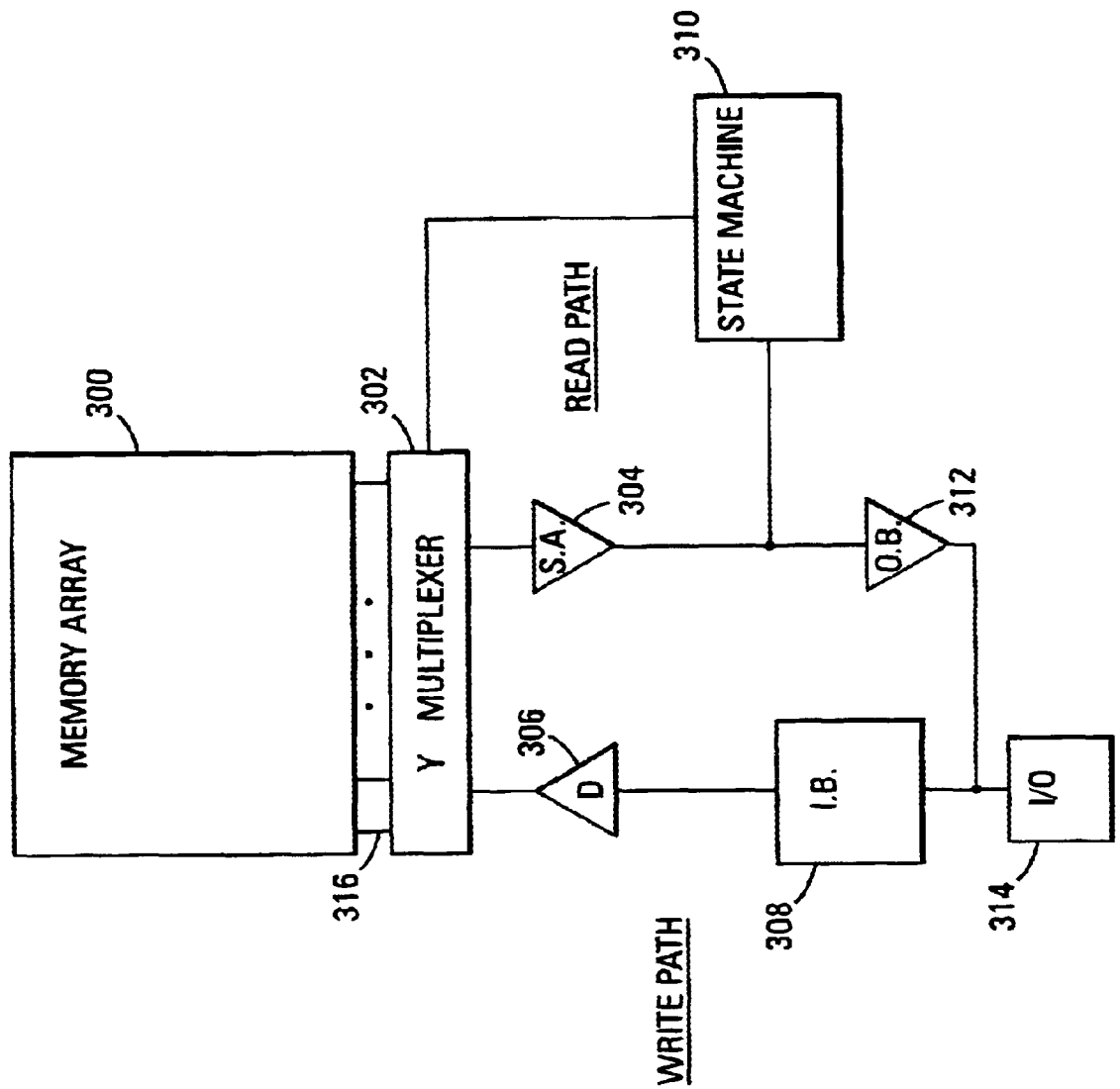
FIG. 1 is a block diagram illustrating the write and read paths of the prior art.

Referring to FIG. 1, a simplified block diagram illustrating the read and write paths of flash memory of the known art is shown. As shown, the read and write paths are coupled to the memory array 300 by Y multiplexer 302. The write path receives data from an input/output connection 314. The write path includes an input buffer 308 and a driver circuit 306. The driver circuit 306 is used to increase the voltage level applied to bit lines 316 coupled to cells within the memory array 300. For example, a 3 volt signal from the input/output connection 314 is increased by the driver circuit 306 to approximately 5.5 volts. The 5.5 volts is then applied to a drain of a respective cell in the memory array 300 when a voltage of approximately 10 volts is applied to the gate of the memory cell to program the memory cell. The Y multiplexer 302 is coupled between the driver circuit 306 and the memory array 300 to selectively couple the program voltage, i.e., the 5.5 volts, to an addressed cell. The Y multiplexer 302 is also shown coupled to a state machine 310. The state machine controls memory operations. In particular, the state machine 310 is coupled to control the operations of the Y multiplexer 302. That is, to direct the Y multiplexer 302 to select a specific bit line.

The read path includes a sense amplifier circuit 304 coupled to receive data from the Y multiplexer 302 and an output buffer 312. The sense amplifier circuit 304 comprises a plurality of sense amplifiers that are used to read the cells in the memory array 300. As stated above, a typical sense amplifier circuit 304 may include 16 sense amplifiers. Generally, in order to select a given line, the Y multiplexer 302 (decoder) is formed with two buses, each with 16 lines to select among a total of 256 bit lines 316. The bit lines 316 are clustered into groups of 16 lines each. There are 16 such groups. The state machine 310 coupled to an output of the sense amplifier circuit 304 to monitor the output of the sense amplifier circuit 304.

Figure 2:
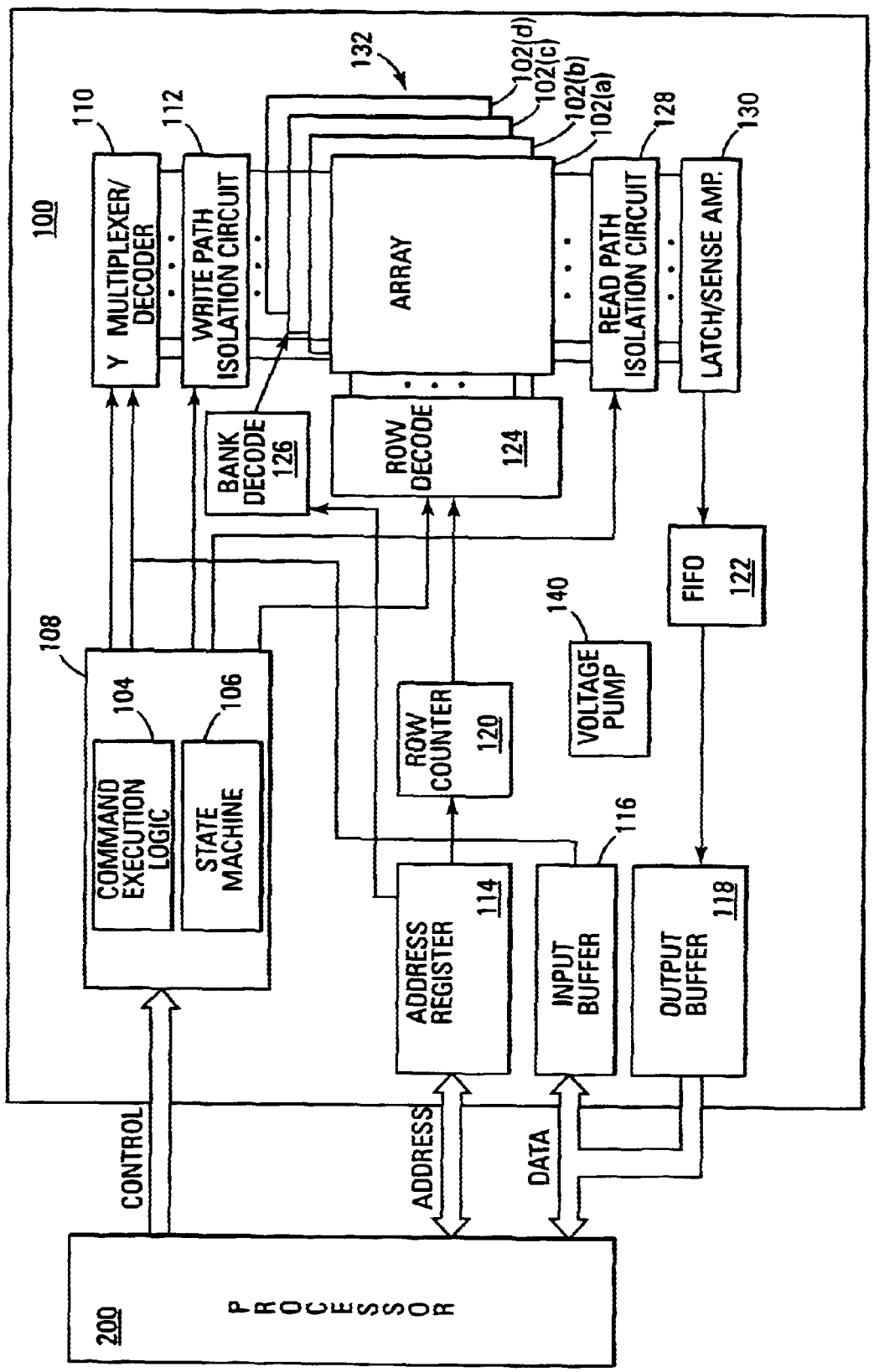
FIG. 2 is a block diagram of one embodiment of the present invention.

Referring to FIG. 2, a simplified block diagram of a synchronous flash memory 100 of an embodiment of the present invention is illustrated. The flash memory 100 is shown having control circuitry 108 to control memory operations to a memory array 132. Such memory operations include reading, writing and erasing. The control circuitry is illustrated as containing command execution logic 104 and a state machine 106. The state machine 106 is commonly referred to as the specific device that controls the memory operations. The synchronous flash memory 100 is also shown having an address register 114, a row counter 120, a row or X decode circuit 124, a bank decode 126, a voltage pump 140 and an input buffer 116. The voltage pump 140 is used to increase the voltage levels during read, write and erase operations. The X decode circuit 124 is used to decode address request to rows of memory cells in the memory array 102. The bank decode 126 is used to decode address requests among the banks 120(a–d) of memory in the memory array 132. Although the synchronous flash memory 100 is shown having four banks of memory, it will be understood in the art that the synchronous flash memory 100 could have more than four or less than four memory banks and the present invention is not limited to four banks of memory.

The synchronous flash memory 100 of FIG. 2 is illustrated as also having a Y multiplexer/decode 110 and write path isolation circuit 112. The Y decode/multiplexer circuit 110 is used to decode and multiplex address requests to columns of memory cells in the memory array 132. The write path isolation circuit 112 decouples the Y multiplexer/decoder circuit 110 from the memory array 132 during read operations.

Also illustrated in FIG. 2 is a latch/sense amplifier circuit 130, a read path isolation circuit 128, a FIFO circuit 122 and an output buffer 118. The latch/sense amplifier circuit 130 is coupled to read addressed or accessed memory cells in the memory array 130. The read path isolation circuit 128 decouples the latch/sense amplifier circuit 130 from the memory array 132 during write operations. A processor 200 is shown coupled to the synchronous flash memory 100 to provide external commands, address requests and data to the synchronous flash memory 100.

Figure 3:
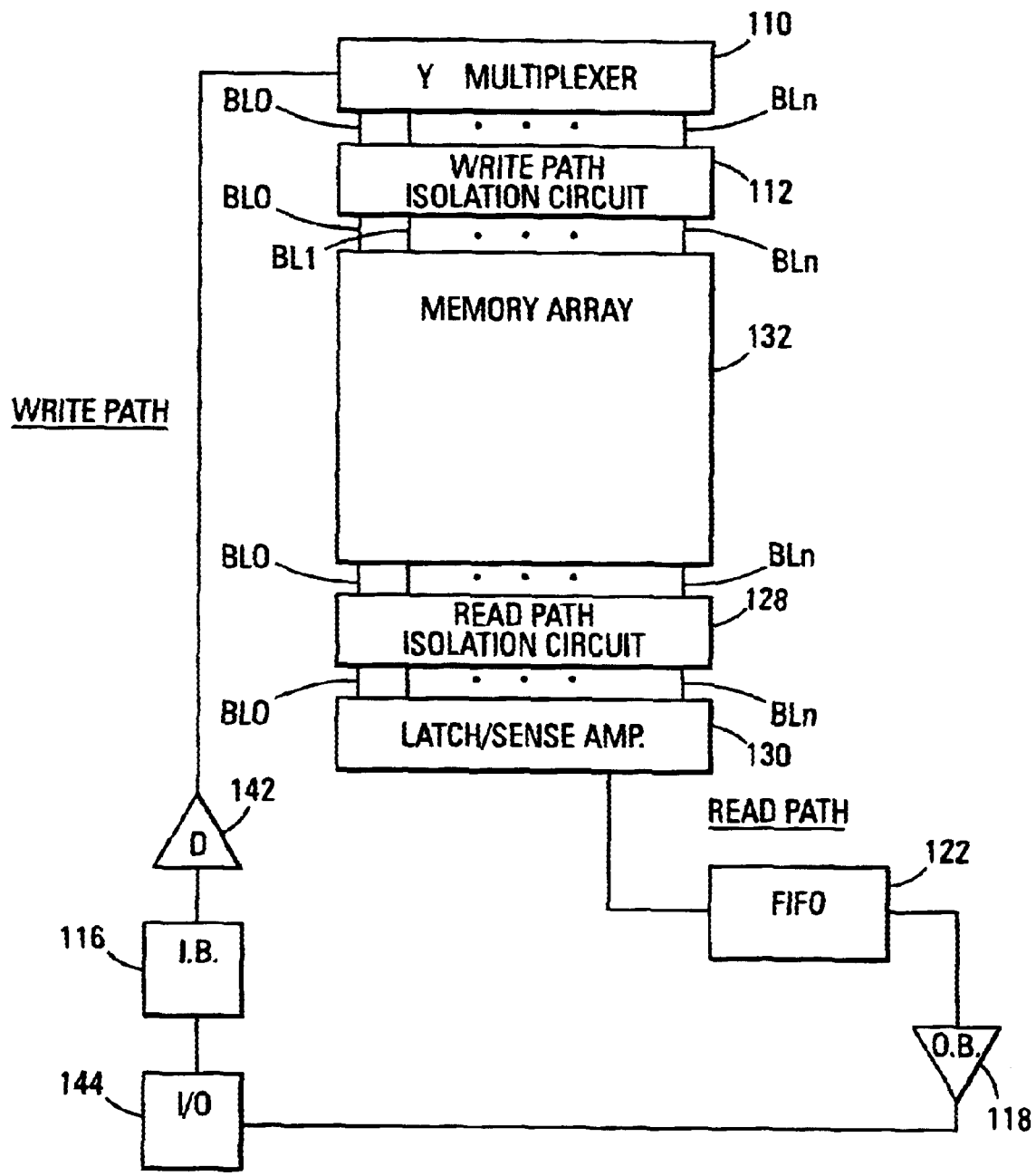
FIG. 3 is a block diagram of the write and read path of one embodiment of the present invention.

Referring to FIG. 3, a block diagram of the read and write paths of one embodiment of the present invention is illustrated. As illustrated, the write path comprises the input buffer 116 coupled to an input/output connection 144 to receive data. A driver circuit 142 is coupled to the input buffer 116 to drive a program voltage (approximately 5.5 volts) when programming a cell. The Y multiplexer 110 is coupled to the driver circuit 142 to direct the program voltage to a selected bit line (BL0–BL1). The write path isolation circuit 112 is coupled between the Y multiplexer 110 and the memory array 132 to selectively decouple the Y multiplexer 110 from the bit lines (BL0–BL1) of the memory array 132 during read operations. Referring back to FIG. 2, the write path isolation circuit 112 is coupled to the control circuitry 108. Wherein the control circuitry 108 selectively activates the write path isolation circuit 112.

The read path of FIG. 3 includes a read path isolation circuit 128 that is coupled to the bit lines (BL0–BL1) at the opposite end of the memory array 132 as the Y multiplexer 110 in the write path. Referring back to FIG. 2, the read path isolation circuit 128 is coupled to the control circuitry 108, wherein the control circuitry 108 selectively activates the read path isolation circuit 122. As illustrated in FIG. 3, a latch/sense amplifier circuit 130 is coupled to the read path isolation circuit 128 by the bit lines (BL0–BL1). In a read operation of a synchronous flash memory 100, a page of memory cells are read at the same time. That is, all the cells coupled to a word line are activated at the same time, thereby dumping their contents into the latch/sense amplifier circuit 130 at the same time. Therefore, the latch/sense amplifier circuit 130 must contain a latch/sense amplifier for each bit line (BL0–BLn). The FIFO circuit 122 is coupled to the latch/sense amplifier circuit 130 to control the flow of data from the latch/sense amplifier circuit 130. As shown the output buffer 118 is coupled between the FIFO circuit 122 and the input/output connection 144.

Once the cells are coupled to an associated word line, the latch/sense amplifier circuit 130 decodes the data. The data can be randomly read within the page at 100 megahertz. To be able to obtain this speed, transistors within the latch/sense amplifier circuit 130 require a thin oxide layer, such as approximately 70 Å, with short channel lengths. Therefore, the Y-multiplexer of a typical flash memory having an oxide layer of approximately 200 Å and a relatively long channel length will not work effectively in synchronous flash memory read paths. In effect, the present invention uses a first multiplexer 110 (the Y multiplexer 110) in the write path, and a second multiplexer 130 (the latch/sense amplifier 130) in the read path. This allows the write path to use the relatively high voltage transistors in Y multiplexer 110 to provide the voltage needed to program cells and the read path to use higher performance, relatively low voltage transistors in latch/sense amplifier circuit 130 in reading the cells.

Figure 4:
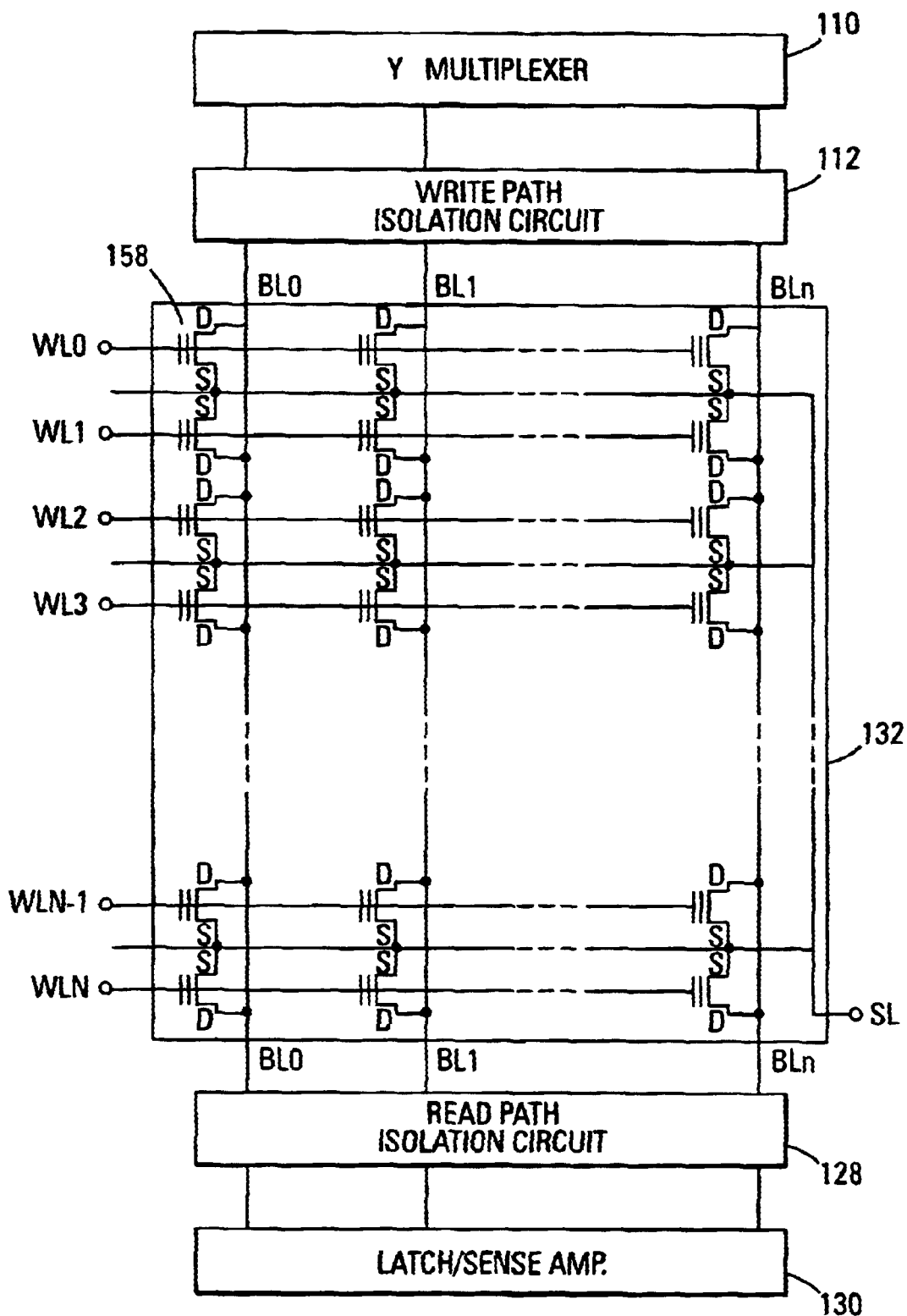
FIG. 4 is a schematic-block diagram illustrating how the bit lines of a block of memory are coupled to the Y multiplexer and the latch/sense amplifier of one embodiment of the present invention.

Referring to FIG. 4, a schematic-block diagram illustrating how the first and second multiplexer 110 and 130 are coupled to the bit lines (BL0--BLn) of one embodiment of the present invention is shown. As shown, the first multiplexer 110 (or Y multiplexer 110) is positioned at a first end of the memory array 132 and coupled to the first end of bit lines (BL0–BLn). More specifically, the write path isolation circuit is coupled between the first multiplexer 110 and the first ends of the bit lines (BL0–BLn). The second multiplexer 130 (or latch/sense amplifier circuit 130) is positioned at a second end of the memory array 132 and coupled to a second end of bit lines (BL0–BLn). More specifically, the read path isolation circuit is coupled between the second multiplexer circuit 128 and the second ends of the bit lines (BL0–BLn). FIG. 4 also illustrates how the cells 158 are coupled to the bit lines (BL0–BLn) and the word lines (WL0–WLn).

Although FIG. 4 illustrates the first multiplexer 110 being coupled to the first end of the bit lines (BL0–BLn), and the second multiplexer 130 being coupled to the second end of the bit lines (BL0–BLn), it will be understood in the art that the first and second multiplexers 110 and 130 may be coupled to the bit lines in another manner and the present invention is not limited to having the first multiplexer 110 coupled to the first ends of the bit lines (BL0–Bln) and the second multiplexer 130 coupled to the second ends of the bit lines (BL0–BLn). For example, the first and second multiplexers 110 and 103 may both be coupled to the same end of the bit lines (BL0–BLn). In addition, as understood in the art, the term multiplexer as used in the present invention is also used to describe a decoder to couple selected inputs with selected outputs.

Figure 5:
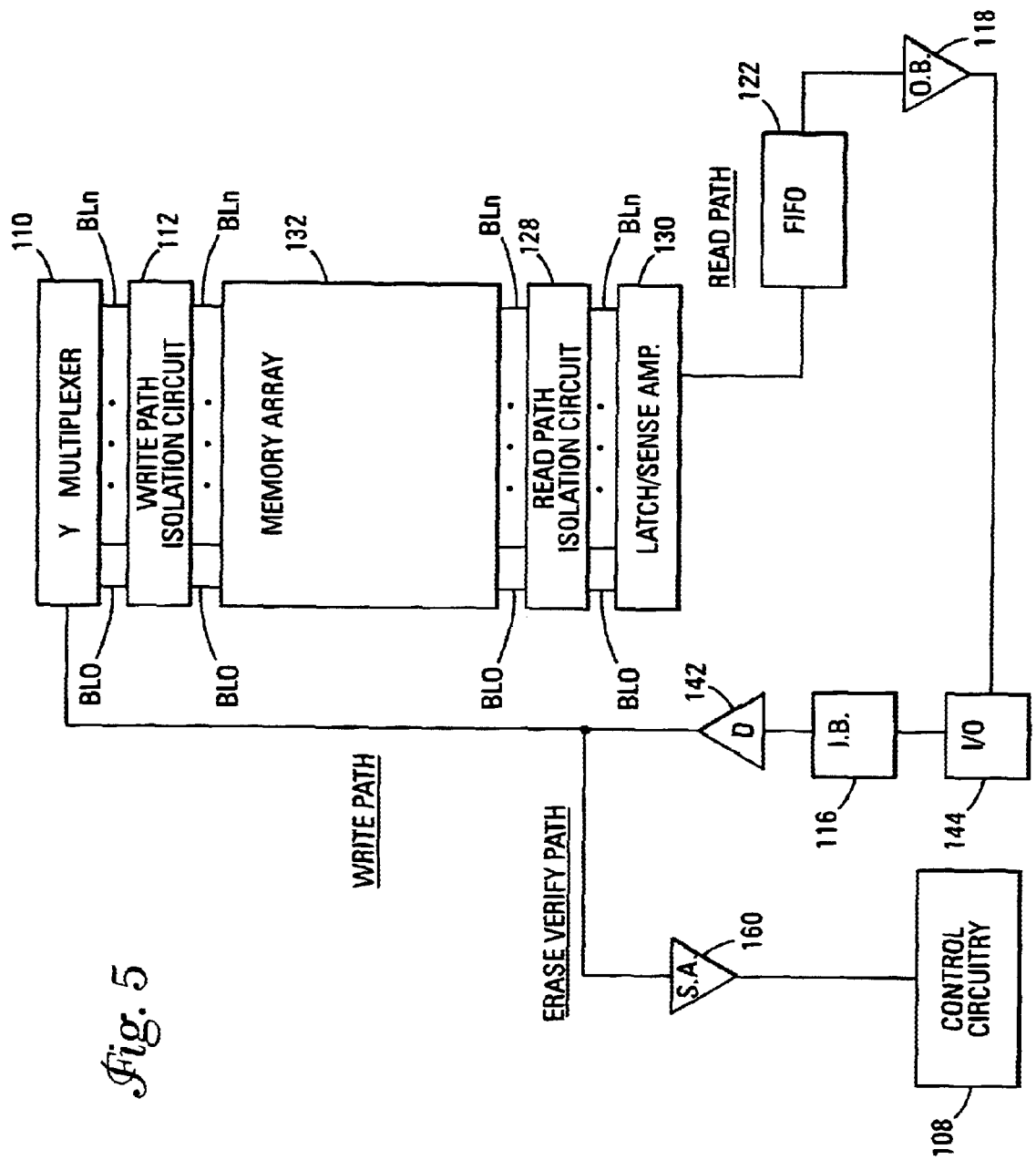
FIG. 5 is a block diagram illustrating an erase verify path of one embodiment of the present invention.

In another embodiment, an erase verify path is coupled to the write path. This embodiment is illustrated in FIG. 5. The erase verify path is used to verify if the cells in a block of memory in the memory array 132 are programmed or erased after an erase pulse has been applied to the block. Since verification of the cells in a block of memory is not done at a page at a time, the high performance transistors of the second multiplexer 130 (latch/sense amplifier 130) is not required. Accordingly, the first multiplexer 110 (Y multiplexer 110) may be used. As illustrated in FIG. 5, the erase verify path includes a sense amplifier circuit 160. The sense amplifier circuit 160 is used to verify programmed and erased memory cells. The sense amplifier circuit 160 is coupled to the control circuitry 108. The control circuitry 180 (or state machine 106) reads an output of the verify circuit 162 in determining if another erase pulse should be applied to the block of cells being erased.

CONCLUSION

A non-volatile memory device having separate read and write paths has been disclosed. In one embodiment, a flash memory device has a memory array, a first multiplexer, and a second multiplexer. The memory array has non-volatile memory cells arranged in columns and rows. Each memory cell in a column is coupled to an associated bit line. The first multiplexer is coupled to select bit lines during write operations to the memory array. The second multiplexer is coupled to select bit lines during read operations from the memory array.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:
   a memory array of non-volatile memory cells arranged in columns and rows, wherein each memory cell in a column is coupled to an associated bit line;
   a first multiplexer coupled to a first end of each bit line to select bit lines during write operations to the memory array; and
   a second multiplexer coupled to a second end of each bit line to select bit lines during read operations from the memory array.

2. The non-volatile memory device of claim 1 further comprising a control circuitry to control memory operations to the memory array, wherein the control circuitry controls the first and second multiplexers.

3. The non-volatile memory device of claim 1 wherein the second multiplexer is a latch/sense amplifier circuit.

4. The non-volatile memory device of claim 1 further comprising:
   a sense amplifier circuit coupled to the first multiplexer to program and erase verify memory cells.

5. The non-volatile memory device of claim 1 further comprising:
   a write path isolation circuit coupled to isolate the first multiplexer from the memory array during read operations; and
   a read path isolation circuit coupled to isolate the second multiplexer from the memory array during write operations.

6. The non-volatile memory device of claim 5 wherein the write path isolation circuit is coupled between the first multiplexer and the memory array and the read path isolation circuit is coupled between the second multiplexer and the memory array.

7. The non-volatile memory device of claim 5 wherein a control circuitry is coupled to control the write path isolation circuit and the read path isolation circuit.

8. A flash memory device comprising:
   a memory array having erasable blocks of memory cells, each block of memory cells is arranged in row and column fashion, wherein each column of memory cells is coupled to an associated bit line;
   a state machine to control memory operations to the memory array;
   a Y multiplexer to select bit lines during write operations, the Y multiplexer is coupled to the state machine to receive select commands, the Y multiplexer is further coupled to a first end of the bit lines; and
   a latch/sense amplifier circuit to selectively read memory cells, the latch /sense amplifier circuit is coupled to the state machine to receive select commands, the latch/sense amplifier circuit is further coupled to a second end of the bit lines.

9. The flash memory device of claim 8 further comprising:
   a write path isolation circuit to selectively decouple the Y multiplexer from the first ends of the bit lines, wherein the write path isolation circuit is activated by the state machine during read operations; and
   a read path isolation circuit to selectively decouple the latch/sense amplifier circuit from the second end of the bit lines, wherein the read path isolation circuit is activated by the state machine during write operations.

10. The flash memory device of claim 9 wherein the write path isolation circuit is coupled between the Y multiplexer and the block of memory cells and the read path isolation circuit is coupled between the latch/sense amplifier circuit and the block of memory cells.

11. The flash memory device of claim 8 further comprising:
    a FIFO circuit coupled to receive an output of the latch/sense amplifier circuit;
    an output buffer coupled to receive an output of the FIFO circuit; and
    an input/output circuit to collect input and output data coupled to the output buffer.

12. The flash memory device of claim 8 further comprising:
    an input/output connection;
    an input buffer to receive data from the input/output connection; and
    a driver circuit is coupled to receive an output of the input buffer, an output of the driver circuit is coupled to the y multiplexer.

13. The flash memory device of claim 8 further comprising:
    a sense amplifier circuit coupled to verify programmed and erased memory cells in the block of memory, the sense amplifier circuit coupled to the state machine, wherein the state machine directs an erase pulse to be applied to the block of memory cells when the sense amplifier circuit reads a memory cell that is not in an erased state.

14. A flash memory device comprising:
    a memory array of non-volatile memory cells arranged in columns and rows, wherein each memory cell in a column is coupled to an associated bit line;
    a first multiplexer coupled to select bit lines during write operations to the memory array; and
    a second multiplexer coupled to select bit lines during read operations from the memory aray.

15. The flash memory device of claim 14 further comprising:
    a state machine to control memory operations to the memory array, wherein the state machine controls the first and second multiplexers.

16. The flash memory device of claim 14 further comprising:
    a sense amplifier circuit to program verify and erase verify the state of memory cells in the flash memory array, the sense amplifier circuit coupled to the first multiplexer.

17. A flash memory device comprising:
    a memory array of non-volatile memory cells arranged in columns and rows, wherein each memory cell in a column is coupled to an associated bit line;

a first multiplexer coupled to select bit lines during write-operations to the memory array;

a second multiplexer coupled to select bit lines during read operations from the memory array;

a write path isolation circuit coupled to isolate the first multiplexer from the memory array during read operations; and a read path isolation circuit coupled to isolate the second multiplexer from the memory array during write operations.

18. The flash memory device of claim 17 wherein a control circuitry is coupled to control the write path isolation circuit and the read path isolation circuit.

19. A flash memory system comprising:

a processor to provide external commands and external data;

a memory array to store data, the memory array having blocks of memory cells arranged in rows and columns, wherein each memory cell in a column has a drain coupled to an associated bit line;

control circuitry to control memory operations, wherein the control circuitry is coupled to the processor to receive the external commands;

a first multiplexer coupled to select among the bit lines during write operations, the first multiplexer is coupled to each bit line, the first multiplexer is further coupled to receive select commands from the control circuitry;

a second multiplexer coupled to select among the bit lines during read operations, the second multiplexer is coupled to each bit line, the second multiplexer further coupled to receive select commands from the control circuitry;

a write path isolation circuit coupled to isolate the first multiplexer from the bit lines during a read operation, the write path isolation circuit is further coupled to receive isolation commands from the control circuitry; and a read path isolation circuit coupled to isolate the second multiplexer from the bit lines during a write operation, the read path isolation circuit is further coupled to receive isolation commands from the control circuitry.

20. The flash memory system of claim 19 wherein the first multiplexer comprises transistors having an oxide layer of approximately 200 Å.

21. The flash memory system of claim 19 wherein the second multiplexer is a latch/sense amplifier circuit that has transistors having oxide layers of approximately 70 Å.

22. The flash memory system of claim 19 wherein the memory array is positioned between the first multiplexer and the second multiplexer.

23. The flash memory system of claim 19 further comprising:

a FIFO circuit coupled to receive an output of the second multiplexer; and an output buffer coupled to an output of the FWFO circuit, the output buffer further coupled to provide data to the processor.

24. The flash memory system of claim 19 further comprising:

an input buffer to receive data; and a driver circuit to increase voltage in response to an output of the input buffer, the driver circuit is coupled to the first multiplexer.

25. The flash memory system of claim 19 further comprising:

a sense amplifier circuit to verify programmed and erased memory cells, the sense amplifier circuit is coupled to the first multiplexer.

26. The flash memory system of claim 25 wherein the control circuitry is coupled to receive an output of the sense amplifier circuit, further wherein the control circuitry directs erase operations based on the output of the sense amplifier circuit.

27. A method of operating a non-volatile memory device comprising:

using a write path having a first multiplexer to selectively program flash memory cells in a memory array, wherein the first multiplexer is coupled to a first end of each bit line in the memory array; and using a read path having a second multiplexer to selectively read the flash memory cells in the memory array, wherein the second multiplexer is coupled to a second end of each of the bit lines in the memory array.

28. The method of claim 27 further comprising:

isolating the first multiplexer from the bit lines during a read operation; and isolating the second multiplexer from the bit lines during a write operation.

29. The method of claim 27 further comprising:

verifying the program state of a flash memory cell using the write path during an erase verification operation.

30. The method of claim 27 wherein the first multiplexer uses relatively high voltage transistors to select among the bit lines.

31. The method of claim 27 wherein the second multiplexer uses high performance relatively low voltage transistors in selecting among the bit lines.

32. A method of operating a flash memory comprising:

selecting among the bit lines of a memory array using a Y multiplexer during write operations to the memory array;

selecting among the bit lines of the memory array using a latch/sense amplifier circuit during read operations from the memory array;

isolating the Y multiplexer from the bit lines during read operations from the memory array; and isolating the latch/sense amplifier circuit from the bit lines during write operations to the memory array.

33. The method of claim 32 further comprising:

verifying the program status of memory cells using the Y multiplexer during erase verification.

34. The method of claim 32 wherein the Y multiplexer is selectively coupled to a first end of each bit line and the latch/sense amplifier circuit is selectively coupled to a second end of each bit line.

35. The method of claim 32 wherein a write path isolation circuit isolates the Y multiplexer for the bit lines during read operations.

36. The method of claim 32 wherein a read path isolation circuit isolates the latch/sense amplifier circuit from the bit lines during write operations.

37. The method of claim 32 wherein a control circuitry controls the selecting and isolating operations.

* * * * *

UNITED STATES PATENT AND TRADEMARK OFFICE
CERTIFICATE OF CORRECTION

PATENT NO.   : 6,614,691 B2
DATED        : September 2, 2003
INVENTOR(S)  : Roohparvar It is certified that error appears in the above-identified patent and that said Letters Patent is hereby corrected as shown below:

Column 9,
Line 57, replace "FWFO" with -- FIFO --

Signed and Sealed this

Sixteenth Day of December, 2003

JAMES E. ROGAN
*Director of the United States Patent and Trademark Office*